United States Patent
Xu et al.

(10) Patent No.: US 11,762,589 B2
(45) Date of Patent: Sep. 19, 2023

(54) DYNAMIC READ-LEVEL THRESHOLDS IN MEMORY SYSTEMS

(71) Applicant: MICRON TECHNOLOGY, INC., Boise, ID (US)

(72) Inventors: Zhongguang Xu, San Jose, CA (US); Tingjun Xie, Milpitas, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 112 days.

(21) Appl. No.: 17/396,386

(22) Filed: Aug. 6, 2021

(65) Prior Publication Data

US 2023/0043877 A1    Feb. 9, 2023

(51) Int. Cl.
| | |
|---|---|
| *G11C 16/26* | (2006.01) |
| *G06F 3/06* | (2006.01) |
| *G11C 16/32* | (2006.01) |
| *G01K 13/00* | (2021.01) |
| *G11C 7/06* | (2006.01) |
| *G11C 7/22* | (2006.01) |
| *G11C 16/34* | (2006.01) |
| *G11C 16/04* | (2006.01) |

(52) U.S. Cl.
CPC .......... *G06F 3/0659* (2013.01); *G01K 13/00* (2013.01); *G06F 3/0604* (2013.01); *G06F 3/0679* (2013.01); *G11C 7/06* (2013.01); *G11C 7/22* (2013.01); *G11C 16/26* (2013.01); *G11C 16/32* (2013.01); *G11C 16/3404* (2013.01); *G11C 16/0483* (2013.01)

(58) Field of Classification Search
CPC .... G06F 3/0659; G06F 3/0604; G06F 3/0679; G01K 13/00; G11C 7/06; G11C 7/22; G11C 16/26; G11C 16/32; G11C 16/3404; G11C 16/0483; G11C 2207/2254; G11C 7/04; G11C 13/0023; G11C 13/0033; G11C 13/0035; G11C 13/004; G11C 13/0061; G11C 16/08; G11C 16/3418; G11C 16/3427; G11C 16/349; G11C 29/02
USPC ....................................... 365/208
See application file for complete search history.

(56) References Cited

U.S. PATENT DOCUMENTS

| | | | | |
|---|---|---|---|---|
| 10,971,215 | B1* | 4/2021 | Yang ....... | G11C 29/44 |
| 11,526,295 | B2* | 12/2022 | Lang ....... | G06F 3/0604 |
| 2022/0050633 | A1* | 2/2022 | Pream ....... | G06F 3/0604 |

* cited by examiner

*Primary Examiner* — Huan Hoang
(74) *Attorney, Agent, or Firm* — Lowenstein Sandler LLP

(57) ABSTRACT

A current operating characteristic value of a unit of the memory device is identified. An operating characteristic threshold value is identified from a set of operating characteristic thresholds, where the current operating characteristic value satisfies an operating characteristic threshold criterion that is based on the operating characteristic threshold value. A set of write-to-read (W2R) delay time thresholds that corresponds to the operating characteristic threshold value is identified from a plurality of sets of W2R delay time thresholds. Each of the W2R delay time thresholds in the set is associated with a corresponding read voltage level. A W2R delay time threshold associated with a W2R delay time threshold criterion is identified from the set of W2R delay time thresholds, where the W2R threshold criterion is satisfied by a current W2R delay time of the memory subsystem. A read voltage level associated with the identified W2R delay time threshold is identified.

20 Claims, 11 Drawing Sheets

400

---

Determine a first current operating characteristic value of a unit of a memory device
402

↓

Identify, from a first set of operating characteristic thresholds, a first operating characteristic threshold value, wherein the first current operating characteristic value satisfies a first operating characteristic threshold criterion that is based on the first operating characteristic threshold value
404

↓

Identify, from a plurality of sets of W2R delay time thresholds, a set of W2R delay time thresholds that corresponds to the first operating characteristic threshold value, wherein each of the W2R delay time thresholds in the set is associated with a corresponding read voltage level
406

↓

Identify, from the set of W2R delay time thresholds, a W2R delay time threshold for which an associated W2R delay time threshold criterion is satisfied by a current W2R delay time of the unit of the memory device
408

↓

Identify a read voltage level associated with the identified W2R delay time threshold
410

Identify a current cycle count associated with a unit of a memory device
422

Identify, from a set of cycle count ranges, a cycle count range that includes the current cycle count
424

Identify, from a plurality of sets of write-to-read (W2R) delay time ranges, a set of W2R delay time ranges that corresponds to the cycle count range, wherein each of the W2R delay time ranges represents a plurality of W2R delay times and is associated with a corresponding read voltage level used to perform a read operation on a unit of the memory device having a W2R delay time that is in the W2R delay time range
426

Identifying a W2R delay time of the unit of the memory device, wherein the identified W2R delay time is based on a time difference between a write operation and a read operation performed by the unit of the memory device
428

Identify, from the set of delay time ranges, a W2R delay time range that includes the W2R delay time of the unit of the memory device
430

Identify the read voltage level that corresponds to the identified W2R delay time range.
432

Perform a read operation at the unit of the memory device based on the determined read voltage level
434

| Read Level 504 | Write-to-read (W2R) Delay Time Thresholds 506 | | | |
|---|---|---|---|---|
| | For Write Count Threshold 1 (e.g., 50,000 writes) 502A | For Write Count Threhsold 2 (e.g., 100,000 writes) 502B | For Write Count Threshold 3 (e.g., 150,000 writes) 502C | For Write Count Threshold N (e.g., 50,000xN writes) |
| Read Level 1 504A | Delay Threshold for RL1, WC1 e.g., 1 microsecond | Delay Threshold For RL1, WC2 e.g., 1 microsecond | Delay Threshold for RL1, WC3 e.g., 1 microsecond | Delay Threshold for RL1, WCn |
| Read Level 2 504B | Delay Threshold for RL2, WC1 e.g., 1 second | Delay Threshold for RL2, WC2 e.g.,0.5 seconds | Delay Threshold for RL2, WC3 e.g.,0.2 seconds | Delay Threshold for RL2, WCn |
| Read Level 3 504C | Delay Threshold for RL3, WC1 e.g., 1 hour | Delay Threshold for RL3, WC2 e.g., 0.5 hours | Delay Threshold for RL3, WC3 e.g., 0.2 hours | Delay Threshold for RL3, WCn |
| | First Set of Delay Time Thresholds 506A | Second Set of Delay Time Thresholds 506B | Third Set of Delay Time Thresholds 506C | |

| Read Level 514 | Write-to-read (W2R) Delay Time Thresholds 516 | | | |
|---|---|---|---|---|
| | For Write Count Range 1 (e.g., 0-50,000 writes) 512A | For Write Count Range 2 (e.g., 50000-100,000 writes) 512B | For Write Count Range 3 (e.g., 100,000-150,000 writes) 512C | For Write Count Range N |
| Read Level 1 514A | Delay Threshold for RL1, WC1 | Delay Threshold For RL1, WC2 | Delay Threshold for RL1, WC3 | Delay Threshold for RL1, WCn |
| Read Level 2 514B | Delay Threshold for RL2, WC1 | Delay Threshold for RL2, WC2 | Delay Threshold for RL2, WC3 | Delay Threshold for RL2, WCn |
| Read Level 3 514C | Delay Threshold for RL3, WC1 | Delay Threshold for RL3, WC2 | Delay Threshold for RL3, WC3 | Delay Th for RL3, WCn |
| | First Set of Delay Time Thresholds 516A | Second Set of Delay Time Thresholds 516B | Third Set of Delay Time Thresholds 516C | |

| Read Level 524 | Write-to-read (W2R) Delay Time Ranges 526 | | | |
| --- | --- | --- | --- | --- |
| | For Write Count Range 1 (e.g., 0-50,000 writes) 522A | For Write Count Range 2 (e.g., 50000-100,000 writes) 522B | For Write Count Range 3 (e.g., 100,000-150,000 writes) 522C | For Write Count Range N |
| Read Level 1 524A | Delay Range for RL1, WC1 e.g., (0s, 1s) | Delay Range for RL1, WC2 e.g., (0s, 0.5s) | Delay Range for RL1, WC3 e.g., (0s, 0.2s) | Delay Range for RL1, WCn |
| Read Level 2 524B | Delay Range for RL2, WC1 e.g., (1s, 1hr) | Delay Range for RL2, WC2 e.g.,(0.5s,0.5hr) | Delay Range for RL2, WC3 e.g.,(0.2s,0.2hr) | Delay Range for RL2, WCn |
| Read Level 3 524C | Delay Range for RL3, WC1 e.g., (1hr, ∞) | Delay Range for RL3, WC2 e.g., (0.5hr, ∞) | Delay Range for RL3, WC3 e.g., (0.2hr, ∞) | Delay Range for RL3, WCn |
| | First Set of Delay Ranges 526A | Second Set of Delay Ranges 526B | Third Set of Delay Ranges 526C | Nth Set of Delay Ranges |

| Read Level 604 | Write-to-read (W2R) Delay Time Offsets 606 ||
| --- | --- | --- |
| | For Temperature Range 1 (e.g., 0-45C) 602A | For Temperature Range 2 (e.g., 45C-70C) 602B |
| Read Level 1 604A | Delay Offset for RL1, temp range 1 e.g., 0 microseconds | Delay Offset for RL1, temp range 2 e.g., 0 microseconds |
| Read Level 2 604B | Delay Offset for RL2, temp range 1 e.g., -100 milliseconds | Delay Offset for RL2, temp range 2 e.g., -300 milliseconds |
| Read Level 3 604C | Delay Offset for RL3, temp range 1 e.g., -2 minutes | Delay Offset for RL3, temp range 1 e.g., -4 minutes |
| | First Set of W2R Delay Time Offsets 606A | Second Set of W2R Delay Time Offsets 606B |

| Read Level 614 | Write-to-read (W2R) Delay Time Offsets 616 ||
| --- | --- | --- |
| | For Deck 0 612A | For Deck 1 612B |
| Read Level 1 614A | Delay Offset for RL1, deck 0 (e.g., 0 microseconds) | Delay Offset for RL1, deck 1 (e.g., 0 microseconds) |
| Read Level 2 614B | Delay Offset for RL2, deck 0 (e.g., -260 milliseconds) | Delay Offset for RL2, deck 1 (e.g., -460 milliseconds) |
| Read Level 3 614C | Delay Offset for RL3, deck 0 (e.g., -1 minutes) | Delay Offset for RL3, deck 1 (e.g., -3 minutes) |

| Read Level 624 | Write-to-read (W2R) Delay Time Offsets 626 ||
|---|---|---|
| | For Electrical Distance 0 622A | For Electrical Distance 1 622B |
| Read Level 1 624A | Delay Offset for RL1, ED 0 (e.g., 0 microseconds) | Delay Offset for RL1, ED 1 (e.g., 0 microseconds) |
| Read Level 2 624B | Delay Offset for RL2, ED 0 (e.g., -325 milliseconds) | Delay Offset for RL2, ED 1 (e.g., -400 milliseconds) |
| Read Level 3 624C | Delay Offset for RL3, ED 0 (e.g., -1 minute) | Delay Offset for RL3, ED 1 (e.g., -2 minutes) |

DYNAMIC READ-LEVEL THRESHOLDS IN MEMORY SYSTEMS

TECHNICAL FIELD

Embodiments of the disclosure relate generally to memory sub-systems, and more specifically, relate to dynamic read-level thresholds in memory sub-systems.

BACKGROUND

A memory sub-system can be a storage system, a memory module, or a hybrid of a storage device and memory module. The memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various implementations of the disclosure. The drawings, however, should not be taken to limit the disclosure to the specific embodiments, but are for explanation and understanding only.

FIG. 4A is a flow diagram of an example method to adjust delay time thresholds and determine a corresponding read level in accordance with some embodiments.

FIG. 4B is a flow diagram of an example method to adjust delay time ranges and perform a read operation using a corresponding read level in accordance with some embodiments.

FIGS. 5A-5C illustrate tables including example sets of write-to-read delay times corresponding to example operating characteristic values of a memory sub-system in accordance with some embodiments.

FIGS. 6A-6C illustrate tables including example sets of write-to-read delay time offsets corresponding to example operating characteristic values of a memory sub-system in accordance with some embodiments.

DETAILED DESCRIPTION

Figure 1:
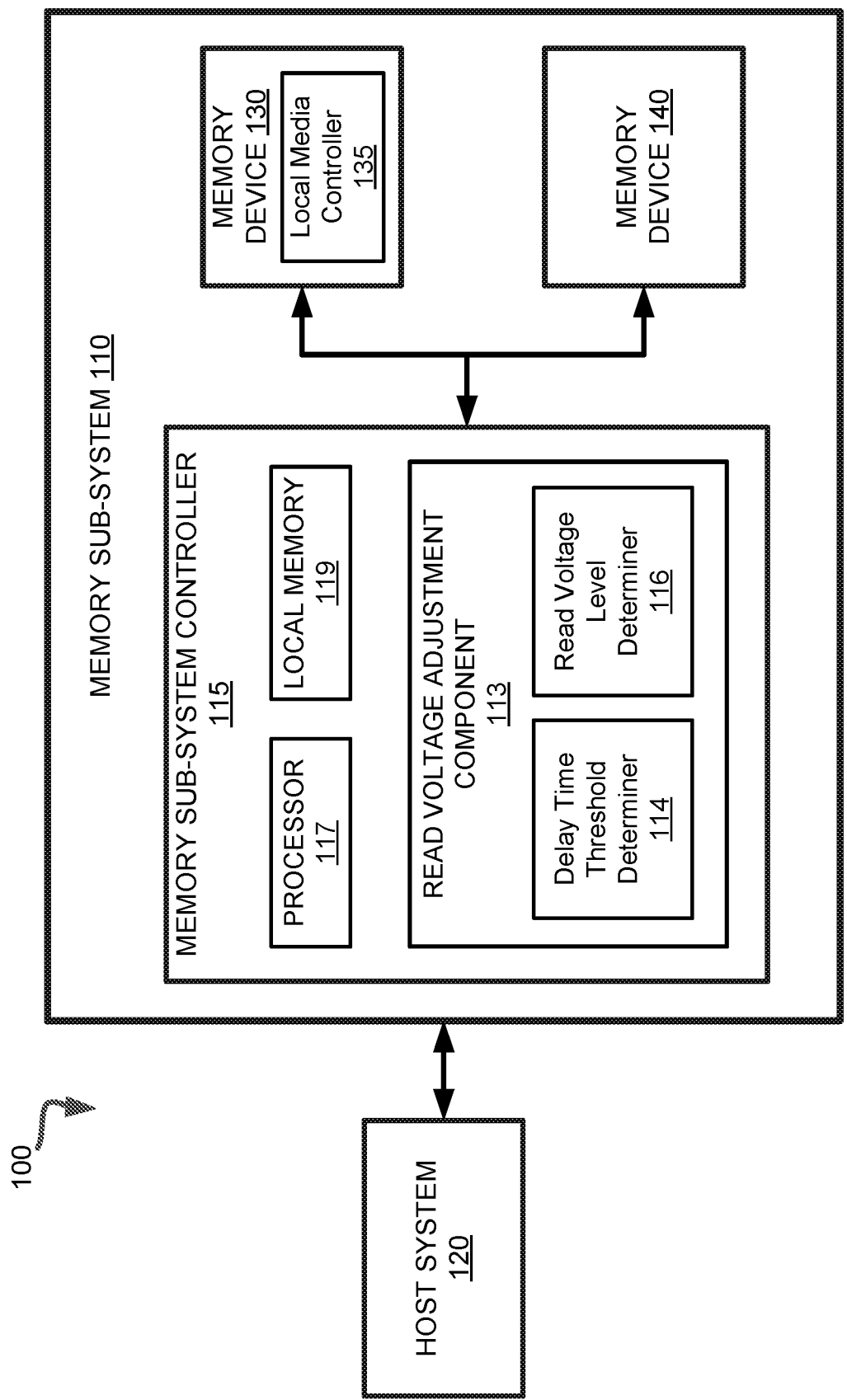
FIG. 1 illustrates an example computing system that includes a memory sub-system in accordance with some embodiments of the present disclosure.

Aspects of the present disclosure are directed to read voltage adjustment for memories in a memory sub-system according to write-to-read delay using adjustable write-to-read delay thresholds based on variations in operating characteristics. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a three-dimensional cross-point ("3D cross-point") memory device that includes an array of non-volatile memory cells. A 3D cross-point memory device can perform bit storage based on a change of bulk resistance, in conjunction with a stackable cross-gridded data access array. Another example is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. A memory device can be called a "drive", which has multiple dies layered in multiple "decks."

A read operation can be performed using a signal (e.g., applied to a wordline of the memory array) having a read voltage level. The read threshold voltage level or value (herein the "read voltage level") can be a particular voltage that is applied to memory cells of a memory device to read the data stored at the memory cells. For example, if a threshold voltage of a particular memory cell is identified as being below the read voltage level that is applied to the particular memory cell, then the data stored at the particular memory cell can be a particular value (e.g., '1') and if the threshold voltage of the particular memory cell is identified as being above the read voltage level, then the data stored at the particular memory cell can be another value (e.g., '0'). Thus, the read voltage level can be applied to memory cells to determine values stored at the memory cells.

In a conventional memory sub-system, when the threshold voltage programming distributions of a memory cell change, the application of the read voltage level can be inaccurate relative to the changed threshold voltage. For example, a memory cell can be programmed to have a threshold voltage below the read voltage level. The programmed threshold voltage can change over time and can shift to be above the read voltage level. For example, the threshold voltage of the memory cell can shift from initially being below the read voltage level to being above the read voltage level. As a result, when the read voltage level is applied to the memory cell, the data stored at the memory cell can be misread or misinterpreted to be at a wrong value as compared to the value as originally stored when the threshold voltage had not yet shifted.

For certain memory types (i.e., for memory sub-systems employing certain types of storage media), error rates can vary over time. In particular, some non-volatile memories have threshold voltage programming distributions that move or "drift" higher over time. At a given read voltage level (i.e., a value of the voltage applied to a memory cell as part of a read operation), if the threshold voltage programming distributions move, then certain reliability statistics can also be affected. One example of a reliability statistic is a bit error rate (BER). The BER can be defined as the ratio of the number of erroneous bits to the number of all data bits stored in a unit of the memory sub-system, where the unit can be the entire memory sub-system, a die of memory device, a collection of codewords, or any other meaningful portion of the memory sub-system.

The speed or rate of the drift of the threshold voltage programming distributions and corresponding BER of a conventional memory sub-system can be affected by one or more operating characteristics of the memory sub-system. Example operating characteristics include wearing condition (e.g., write count), die temperature and a write-to-read (W2R) delay time (i.e., a period of time that elapses between when a memory unit of the memory device (e.g., a memory page) is written and when the same memory unit is read). For example, the drift speed is faster at higher die temperatures than at lower temperatures when experiencing a same W2R delay time. In another example, longer W2R delay times produce greater threshold voltage drifts as compared to shorter W2R delay times. In this example, the read retry trigger rate (i.e., a rate of errors that trigger error correction processing) is higher for longer W2R delay times than it is for shorter W2R delay times.

Existing memory sub-systems adjust the read voltage level based on a W2R delay time by establishing one or more static W2R delay time ranges, and associating a read voltage level with each static W2R delay time range. The read voltage level is adjusted at appropriate times by measuring a current W2R delay time and identifying the static W2R delay time range to which the current W2R delay time corresponds. The read voltage level associated with the identified static W2R delay time range is then used to perform read operations. For example, two static W2R delay time ranges (having associated W2R delay time thresholds) can be defined by a drift-tracking feature of the memory sub-system: a first threshold having a value of 50,000 write cycles, and a second threshold having a value of 100,000 write cycles. Each threshold can correspond to a boundary or end of a static range of write cycles. Thus, in this example, the first threshold corresponds to a first static range of 0-50,000 cycles, and the second threshold corresponds to a second static range of 50,000-100,000 cycles.

The drift tracking feature associates the first static W2R delay time threshold with a first read voltage level optimized for the first static range of write cycles, and associates the second static W2R delay time threshold with a second read voltage level optimized for the second static range of write cycles. The drift tracking feature can measure a current W2R delay time at an appropriate time during operation of the memory sub-system, and adjust the read voltage level based on which of the static ranges the current W2R delay time falls into. For example, if the current W2R delay time falls in the first static range that ends at the first threshold, then the read voltage level is set to the first read voltage level, since the first read level is associated with the first static threshold. If the current W2R delay time falls in the second static range that ends at the second threshold, then the read voltage level is set to the second read voltage level, since the since the second read voltage level is associated with the second static threshold.

The static W2R delay thresholds used by the drift tracking feature are set to satisfy an acceptable BER for the memory device. The preset static W2R delay thresholds are constant and unchanged during multiple different lifecycle stages of the memory device, including a beginning of life (BOL) stage, a middle of life (MOL) stage, and an end of life stage (EOL). Thus, in operation, the drift tracking feature uses static W2R delay time thresholds that are optimized for particular operating characteristics, such as a particular wearing condition (e.g., the write count range corresponding to an EOL stage) and particular a temperature. However, the appropriate W2R delay threshold for accurately determining whether the read voltage level has a first value or a second value can change with the wearing condition, temperature, and/or other operating characteristics of the memory device, because the operating characteristics affect the amount of threshold voltage shift. The static W2R delay thresholds used to adjust the read voltage levels are not necessarily appropriate for accurately determining the read voltage level under certain operating conditions, such as wearing conditions or temperatures substantially different from those for which the static W2R delay thresholds are optimized. Accordingly, the use of static W2R delay thresholds causes system performance degradation since read errors and read retries occur more frequently, and increased degradation as a result of the increase number of retried read operations.

Aspects of the present disclosure address the above and other deficiencies by using a read voltage adjustment technique based on comparison of a write-to-read delay time to one or more time thresholds that are adjusted in accordance with changes in operating characteristics of a memory sub-system. In one implementation, each delay time threshold is associated with a read voltage level, and the memory sub-system identifies the read-voltage level to use for a read operation by determining a current write-to-read delay time and determining which of the delay time thresholds the current write-to-read delay time corresponds to (e.g., exceeds without exceeding any higher delay time threshold). The delay time threshold that corresponds to the current write-to-read delay time has an associated read voltage level, which the memory sub-system can use to perform a read operation. The memory sub-system can determine the current write-to-read delay time based on a time difference between read and write operation, for example.

The memory sub-system adjusts the delay time thresholds based on operating characteristics of the memory sub-system, such as a cycle count, an operating temperature, which layer of a memory device contains a cell to be read, or which area of the layer contains the cell to be read. The memory sub-system can determine the delay time threshold values based on particular values of the operating characteristics using a mapping from operating characteristic values to delay time threshold values. The mapping can specify multiple delay time threshold values, and operating characteristic values (e.g., as thresholds or ranges) for which each delay time threshold value is to be used. The delay time threshold values can be specified as specific values or as offsets to be applied to specific values. The memory sub-system can adjust the write-to-read delay time thresholds at suitable times during operation, e.g., at particular cycle count thresholds, in response to changes in the operating characteristics, at periodic times, or based on other criteria.

In other implementations, the memory sub-system can maintain a plurality of write-to-read delay time ranges and adjust the ends of the ranges in accordance with changes in operating characteristics. The ranges' ends can correspond to the delay time thresholds described above. The ranges are adjusted based on operating characteristics at suitable times, similarly to the adjustment of delay time thresholds described above. Each range is associated with a read voltage level. The memory sub-system can perform a read operation using the read voltage level associated with the range into which the current read-to-write delay falls.

Advantages of the present disclosure include, but are not limited to, improved performance across a range of operating conditions, including wear conditions related to write counts, temperature conditions, memory device layers, and areas of memory device layers. Different layers (or areas of layers) can have different physical properties that affect the delay time thresholds. Advantageously, adjusted write-to-read delay thresholds can be identified and applied based on the one or more operating characteristics of the memory sub-system, such as a write count, temperature level, layer, or area of a layer. The adjustment of the W2R delay based on operating characteristics improves the efficiency and performance for wider ranges of operating characteristics that are different from those for which static write-to-read delay thresholds can be optimized. The improved efficiency and performance in these wider ranges of operating characteristics can include, for example, fewer errors and read retries, which can also result in slower media degradation.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, a vehicle (e.g., airplane, drone, train, automobile, or other conveyance), Internet of Things (IoT) devices, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type memory are described, the memory device 130 can be based on any other type of non-volatile memory, such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory component can include an SLC portion, and an MLC portion, a TLC portion, or a QLC portion of memory cells. The memory cells of the memory devices 130 can be grouped as pages or codewords that can refer to a logical unit of the memory device used to store data. With some types of memory (e.g., NAND), pages can be grouped to form blocks. Some types of memory, such as 3D cross-point, can group pages across dice and channels to form management units (MUs).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a read voltage adjustment component 113 that can be used to determine an adjusted read threshold value based on adjustable W2R delay thresholds. The read voltage adjustment component 113 includes a delay time threshold determiner 114 and a read voltage level determiner 116. The read voltage adjustment component 113 monitors operating characteristics of the memory sub-system 110 and adjust the W2R delay thresholds based the operating characteristics. In an embodiment, the operating characteristic can be a measured, determined or calculated value or level corresponding to a characteristic or condition of the memory sub-system 110 during operation of the memory sub-system 110. In an embodiment, the operating characteristic can be an operational level or condition that affects a threshold voltage drift of the memory sub-system 110. For example, the operating characteristic can be cycle count, a temperature, a deck (which can correspond to a layer), or an electrical distance (which can correspond to an area of a deck) of the memory sub-system.

In some embodiments, the controller 115 includes at least a portion of the read voltage adjustment component 113. The memory sub-system 110 can adjust the W2R delay thresholds at suitable times during operation, e.g., at particular write count thresholds, in response to changes in the operating characteristics, at periodic times, or based on other criteria. The delay time threshold determiner 114 can determine a set of delay time thresholds based on one or more operating characteristics of the memory sub-system 110. Each of the delay time thresholds in the set can correspond to a range of delay times. Each of the delay time thresholds (or ranges) can be associated with a corresponding read voltage level to be used in read operations when a W2R delay time of the memory sub-system 110 corresponds to the associated threshold (e.g., satisfies a criterion associated with the corresponding threshold) (or falls into the corresponding range). The read voltage level determiner 116 can determine a read voltage level to use in read operations by determining a current W2R delay time and determining which of the thresholds the current W2R delay time corresponds to (or which of the ranges the current W2R delay time falls into). The corresponding read voltage level associated with the determined threshold (or range) is then used by the memory sub-system 110 to perform a read operation.

For example, the controller 115 can include a processor 117 (processing device) configured to execute instructions stored in local memory 119 for performing the operations described herein. In some embodiments, the read voltage adjustment component 113 is part of the host system 120, an application, or an operating system. In the same or alternative embodiments, portions of the read voltage adjustment component 113 are part of the host system 120 while other portions of the read voltage adjustment component 113 are performed at the controller 115.

In an embodiment, based on operating characteristics of the memory sub-system 110, the read voltage adjustment component 113 determines a set of W2R delay thresholds that can subsequently be used to determine a read level that corresponds to the operating characteristics. During operation of the memory sub-system 110, the read voltage adjustment component 113 determines a current set of operating characteristic values of the memory sub-system (e.g., the write count and temperature) and, using a data structure (e.g., via a look-up operation) that maps operating characteristic values to sets of W2R delay thresholds, identifies a corresponding set of W2R delay thresholds. For example, the data structure can include a plurality of sets of W2R delay thresholds, and each set can be associated with an operating characteristic threshold. The read voltage adjustment component 113 can compare a current operating characteristic value, such as the current write count, to an operating characteristic threshold associated with each set of W2R delay thresholds. The comparison can be performed using a criterion that is based on the operating characteristic threshold. The read voltage adjustment component 113 can select the set of W2R delay thresholds for which the criterion is satisfied by the current operating characteristic value. A current operating characteristic value can satisfy a criterion based on an operating characteristic threshold if, for example, the current operating characteristic value is between the operating characteristic threshold and a next lower (or next higher) operating characteristic threshold. "Between" when used in reference to thresholds or ranges can indicate an inclusive threshold or range that includes the threshold value or a range's end value (e.g., a is between 0 and a threshold if $0<=a<=threshold$), or can indicate an exclusive threshold or range that includes values up to the threshold value or range's end value, but does not include the threshold value or range's end value (e.g., $0<a<threshold$). Whether a particular threshold or range is inclusive of the threshold value or range end value can be specified by information associated with the threshold or range, such as a criterion that includes the threshold or range. For example, a criterion based on a threshold can be $0<=a<=threshold$, which is satisfied by values of a that are between 0 and the threshold, inclusive of 0 and the threshold.

Each W2R delay threshold in the corresponding set of W2R delay thresholds is associated with a read voltage level. For example, the data structure described above can further associate each W2R delay threshold in each set of W2R delay thresholds with a corresponding read level. Thus, if a current W2R delay of the memory sub-system 110 satisfies a criterion based on one of the W2R delay thresholds, then the read voltage adjustment component 113 can cause the memory sub-system controller 115 to perform subsequent read operations using the read voltage level associated with the W2R delay threshold that is satisfied by the current W2R delay. A current W2R delay can satisfy a criterion based on a W2R delay threshold in a set of W2R delay thresholds if, for example, the current W2R delay is between the W2R delay threshold and a next lower (or next higher) W2R delay threshold in the set. "Between" when used in reference to thresholds or ranges can indicate an inclusive threshold or range that includes the threshold value or a range's end value (e.g., a is between 0 and a threshold if $0<=a<=threshold$), or can indicate an exclusive threshold or range that includes values up to the threshold value or range's end value, but does not include the threshold value or range's end value (e.g., $0<a<threshold$). Whether a particular threshold or range is inclusive of the threshold value or range end value can be specified by information associated with the threshold or range, such as a criterion that includes the threshold or range. For example, a criterion based on a threshold can be $0<=a<=threshold$, which is satisfied by values of a that are between 0 and the threshold, inclusive of 0 and the threshold.

In an embodiment, W2R delay time thresholds can be determined as a function of multiple different types of operating characteristics. The read voltage adjustment component 113 can determine each W2R delay time threshold as a sum of a base threshold value and one or more W2R delay offset values. The base threshold value can be a time quantity determined for a first type of operating characteristic associated with the memory device (e.g., write count, as described above), and each offset value can be a time quantity determined for a corresponding different type of operating characteristic associated with the memory device (e.g., temperature, deck, electrical distance, or other operating characteristic). Thus, a temperature-based W2R delay offset can be determined and added to the base threshold value. Similarly, a deck-based offset can be determined based on a deck identifier of a memory device, and an electrical-distance-based offset can be determined based on an electrical distance of a memory device, and added to the base threshold value. Further, if the base threshold value is determined based on an operating characteristic other than write count, a write-count-based offset can be determined based on a write count and added to the base threshold value.

The offset for each type of operating characteristic (e.g., temperature, deck, electrical distance, write count, or other operating characteristic) can be determined using a data structure that maps operating characteristic values of the offset's type to sets of W2R delay offsets. For example, the temperature-based offset can be determined using a data structure that maps temperatures to sets of delay time offsets. The read voltage adjustment component 113 can compare a current temperature of the memory device to a temperature range associated with each set of W2R delay offsets in the table. The read voltage adjustment component 113 can select the set of W2R delay offsets associated with the temperature range into which the current temperature falls. Offsets for other types of operating characteristics can be determined similarly.

In the same or alternate embodiments, a data structure can map operating characteristic values to sets of W2R delay ranges instead of or in addition to threshold values. A threshold value can represent one end of a range, and the other end of the range can be represented by another threshold value. The read voltage adjustment component 113 can determine a current set of operating characteristic values of the memory sub-system (e.g., the write count and temperature) and, using the data structure (e.g., via a look-up operation) that maps operating characteristic values to sets of W2R delay ranges, identify a corresponding set of W2R delay ranges. For example, the data structure can include a plurality of sets of W2R delay ranges, and each set can be associated with an operating characteristic range. A range can include a first end and a second end. A value can fall into a range if the value is between the first end and the second end. The read voltage adjustment component 113 can determine which of the operating characteristic ranges a current operating characteristic value, such as the current write count, falls into, and select the set of W2R delay thresholds associated with the range the current operating characteristic falls into.

Each W2R delay range in the corresponding set of W2R delay ranges is associated with a read voltage level. For example, the data structure described above can further associate each W2R delay range in each set of W2R delay ranges with a corresponding read level. Thus, if a current W2R delay of the memory sub-system 110 falls into one of the W2R delay ranges on a set, then the read voltage adjustment component 113 can cause the memory sub-system controller 115 to perform subsequent read operations using the read voltage level associated with the W2R delay range into which the current W2R delay falls. The delay offsets described above can be added to one or both ends of the corresponding W2R delay range. Further details relating to the operations of the read voltage adjustment component 113 are described below.

Figure 2A:
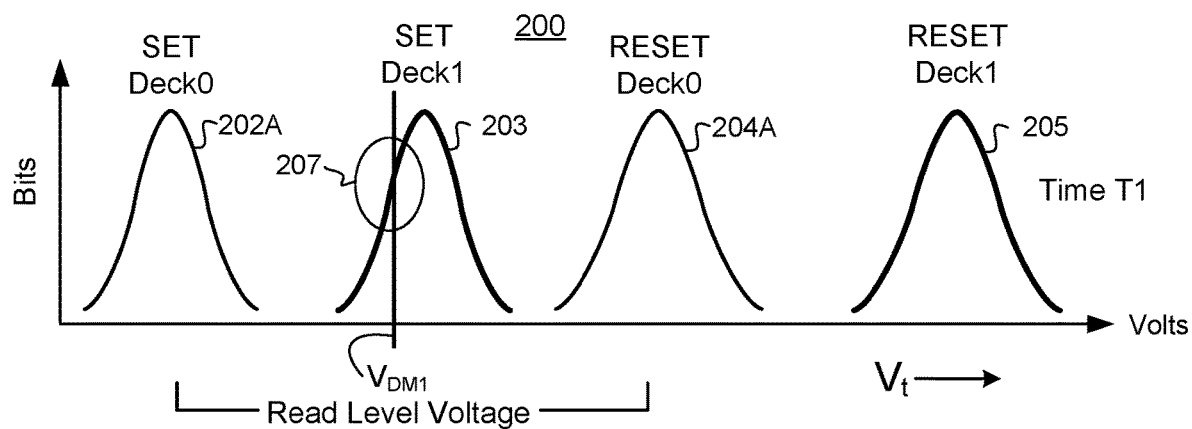
FIGS. 2A-2C illustrate examples of voltage shift in accordance with some embodiments.
Figure 2B:
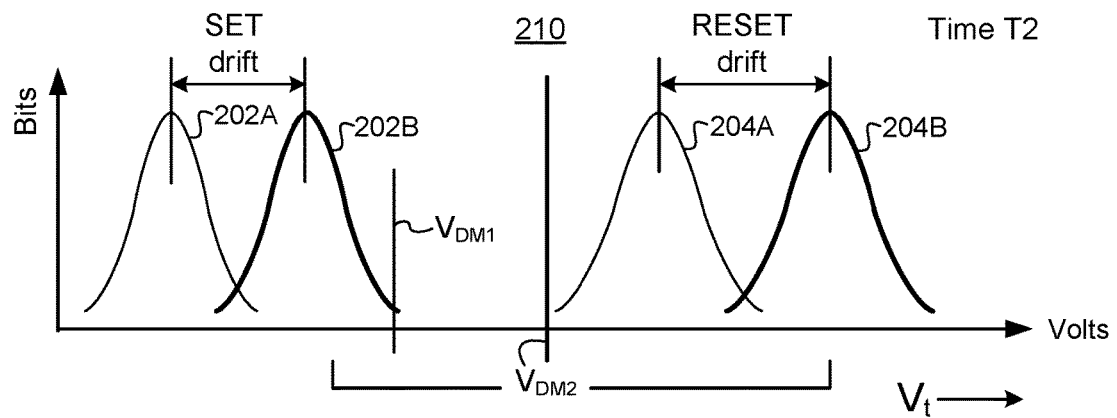
Figure 2C:
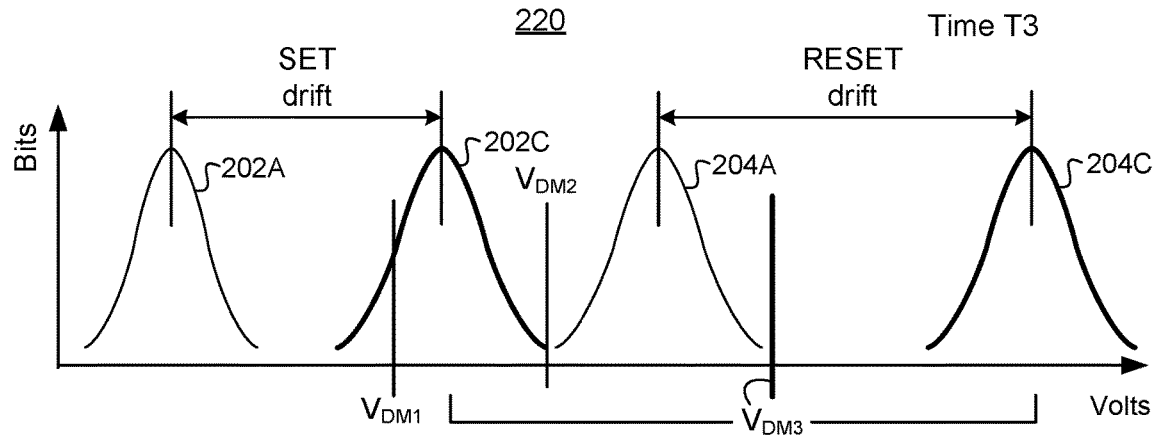

FIGS. 2A-2C illustrate examples of voltage shift in accordance with some embodiments. FIG. 2A illustrates a graph 200 at an initial time T1. Shown on the graph 200 are a SET voltage distribution 202A, which corresponds to a programmed value of, e.g., 0, and a RESET voltage distribution 204A, which corresponds to a programmed value of, e.g., 1. The horizontal (Volts) axis represents voltage values, which increase toward the right. An initial read voltage level VDM1 demarcates the SET distribution 202A and RESET distribution 204A for a particular region (e.g., deck or electrical distance) of a memory device of the memory sub-system for a particular number of cycles. However, for the same number of cycles, the read voltage level VDM1 does not clearly demarcate the SET distribution 203 and RESET distribution 205 at a different region (e.g., a different deck or a different electrical distance) of the memory sub-system. The bits for the different region within the oval 207 enclosing the intersection of VDM1 and SET distribution 203 are likely to be read as erroneous values because of the sub-optimal VDM1 for the different deck (or electrical distance). Thus, the read voltage level VDM1 is not suitable for use in read operations on the different region of the memory sub-system, and a different read level voltage that clearly demarcates SET distribution 203 and RESET distribution 205 is preferable to VDM1.

FIG. 2B illustrates a graph 210 at a time T2 that occurs after time T1. The initial SET distribution 202A has drifted to a first shifted SET distribution 202B during the time between T1 and T2. Similarly, the initial RESET distribution 204A has drifted to a first shifted RESET distribution 204B during the same time. VDM1 is a sub-optimal read voltage level at time T2, because VDM1 overlaps the first shifted SET distribution 202B. A different read level voltage VDM2 that clearly demarcates the first shifted SET distribution 202B and the first shifted RESET distribution 204B is more optimal than VDM1 at time T2.

FIG. 2C illustrates a graph 220 at a time T3 that occurs after time T2. As can be seen, the RESET distribution has drifted farther to the left than the SET distribution since time T2 because the RESET distribution drifts at a faster rate than the SET distribution. Thus, the different distributions drift at different rates. The first shifted SET distribution 202B has drifted to a second shifted SET distribution 202C during the time between T2 and T3. Similarly, the first shifted RESET distribution 204B has drifted to a second shifted RESET distribution 204B during the same time. VDM2 is a sub-optimal read voltage level at time T3, because VDM2 overlaps the second shifted SET distribution 202C. A different read level voltage VDM3 that clearly demarcates the second shifted SET distribution 202C and the second shifted RESET distribution 204C is more optimal than VMD2 at time T3.

Figure 3A:
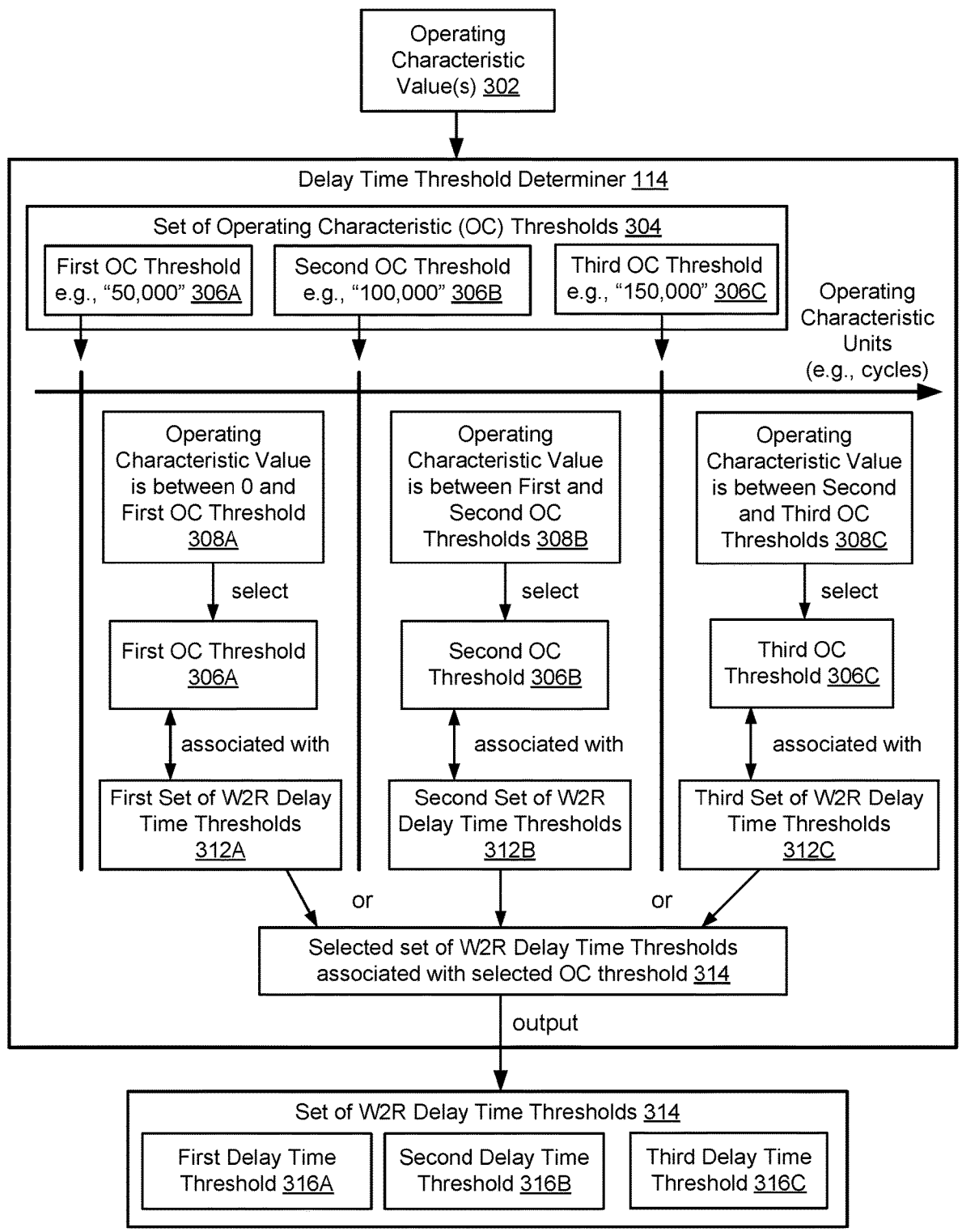
FIG. 3A illustrates an example delay time threshold determiner that adjusts write-to-read delay time thresholds in accordance with some embodiments.

FIG. 3A illustrates an example delay time threshold determiner 114 that adjusts write-to-read delay time thresholds in accordance with some embodiments. The delay time threshold determiner 114 receives one or more current operating characteristic values 302 as input. Each operating characteristic value 302 can be a characteristic of one or more units of a memory device 130 of a memory sub-system 110. The operating characteristic values 302 can include a cycle count, such as a write count, a temperature, a deck, an electrical distance, or other characteristics of a unit of the memory device 130. A temperature of a memory device 130 can be based on, e.g., a measurement of a temperature of the memory sub-system 130 or a measurement of a temperature of the memory device 130. A deck can be, e.g., a layer of a memory device 130. An electrical distance can be, e.g., the distance from a voltage source to the memory cells in a memory array of a memory device 130. An electrical distance can correspond to an area of a deck. For example, a first electrical distance can correspond to a first area containing cells of a first distance from a voltage source, and a second electrical distance can correspond to a second area containing cells of a second distance from the voltage source.

The delay time threshold determiner 114 determines a set of W2R delay time thresholds 314 based on the operating characteristic values 302. The delay time threshold determiner 114 includes or accesses a set of operating characteristic ("OC") thresholds 304, each of which is associated with a set of delay time thresholds 314. The OC thresholds 304 and the delay time thresholds 312 can be determined from media characterization information associated with the memory device 130, and/or from empirical data, for example. The OC thresholds 304 and the associated sets of delay time thresholds 312 can be stored in a data structure such as the mapping table 500 of FIG. 5A or other representation of a mapping table, for example. The set of OC thresholds 304 includes first, second, and third OC thresholds 306A, 306B, and 306C respectively. The data structure associates each of the OC thresholds 306 with a corresponding set of W2R delay time thresholds 312, and further associates each W2R delay time threshold 316 in each set of W2R delay time thresholds 312 with a voltage read level, which is described below with respect to FIG. 3B.

The delay time threshold determiner 112 can select the set of W2R delay thresholds 312 for which a corresponding criterion 308 is satisfied by the current operating characteristic value(s) 302. To select the set of W2R delay thresholds 312, the delay time threshold determiner 114 compares, for each set of W2R delay thresholds 312, the current operating characteristic value(s) 302 to an OC threshold 306 associated with the set of W2R delay thresholds 312. The comparison can be performed using the criterion 308 that is based on the OC threshold 306 to which the criterion 308 corresponds. For example, criterion 308A ("between 0 and first OC threshold") is associated with the first OC threshold 306A ("50,000").

If the current operating characteristic value 302 satisfies the criterion 308, then the delay time threshold determiner 112 can select the OC threshold 306A to which the satisfied criterion 308 corresponds. The delay time threshold determiner 112 can then select the set of W2R delay time thresholds 312 associated with the selected OC threshold 306. For example, the first set of W2R delay time thresholds 312A is associated with the first OC threshold 306A, so the selected set of W2R delay time thresholds 314 is the first set of W2R delay time thresholds 312A when the operating characteristic value 302 satisfies the criterion 308A that is based on the first OC threshold 306A. Similarly, as another example, the second set of W2R delay time thresholds 312B is associated with the second OC threshold 306B, so the selected set of W2R delay time thresholds 314 is the second set of W2R delay time thresholds 312B when the operating characteristic value 302 satisfies the criterion 308B that is based on the second OC threshold 306B. As yet another example, the third set of W2R delay time thresholds 312C is associated with the third OC threshold 306C, so the selected set of W2R delay time thresholds 314 is the third set of W2R delay time thresholds 312C when the operating characteristic value 302 satisfies the criterion 308C that is based on the third OC threshold 306C.

For example, the first OC threshold 306A can be 50,000 writes, and a first criterion "between 0 and 50,000" can be based on the first OC threshold 306A. The second OC threshold 306B can be 100,000 writes, and a second criterion "between 50,000 and 100,000" can be based on the second OC threshold 306B. The third OC threshold 306C can be 150,000 writes, and a third criterion "between 100,000 and 150,000" can based on the third OC threshold 306C. If the operating characteristic value is 65,000 writes, for example, then the delay time threshold determiner 114 selects the second set of W2R delay time thresholds 312B because 65,000 satisfies the second criterion ("between 50,000 and 100,000 writes").

The selected set of W2R delay time thresholds 314 includes one or more delay time thresholds 316, such as a first delay time threshold 316A, which corresponds to a first read level, a second delay time threshold 316B, which corresponds to a second read level, and a third delay time threshold 316C, which corresponds to a third read level. A delay time threshold 316 can be selected from the set of W2R delay time thresholds 314 and used to identify a read level as described below with respect to FIG. 3B.

In an embodiment, a current operating characteristic value 302 can satisfy a criterion based on an OC threshold 306 if, for example, the current operating characteristic value is between the OC threshold 306 and a higher (or next lower) operating characteristic threshold 306. As an example, the delay time threshold determiner 114 can select a set of W2R delay thresholds 314 as follows. Since the operating characteristic value of 65,000 is between the first and second OC thresholds 306A, 306B, and the delay time threshold determiner 114 selects (e.g., by convention) the upper threshold of the range that includes the operating characteristic value 302, the selected threshold is the second OC threshold 306B. The set of W2R delay time thresholds 312B associated with the selected threshold (306B) is the second set of W2R delay time thresholds 312B.

In an embodiment, the delay time threshold determiner 114 can determine the W2R delay time thresholds 316 as a function of multiple different types of operating characteristics 302. The delay time threshold determiner 114 can determine each W2R delay threshold as a sum of a base threshold value and one or more W2R delay offset values. The base threshold value can be a time quantity determined for a first type of operating characteristic associated with the memory device (e.g., write count, as described above), and each offset value can be a time quantity determined for a corresponding different type of operating characteristic associated with the memory device (e.g., temperature, deck, electrical distance, or other operating characteristic). Thus, the delay time threshold determiner 114 can determine a temperature-based W2R delay offset and add the offset to the base threshold value. Similarly, the delay time threshold determiner 114 can determine a deck-based offset based on a deck identifier of a memory device, and an electrical-distance-based offset can be determined based on an electrical distance of a memory device, and add those offsets to the base threshold value. Further, if the base threshold value is determined based on an operating characteristic other than write count, the delay time threshold determiner 114 can determine a write-count-base offset based on a write count.

The delay time threshold determiner 114 can determine the offset for each type of operating characteristic (e.g., temperature, deck, electrical distance, write count, or other operating characteristic) using a data structure that maps operating characteristic values of the offset's type to sets of W2R delay offsets. For example, the temperature-based offset can be determined using a data structure, such as a temperature offset table 600 shown in FIG. 6A, that maps temperatures to sets of delay time offsets. The read voltage adjustment component 113 can compare a current temperature of the memory device to a temperature range associated with each set of W2R delay offsets in the table. The read voltage adjustment component 113 can select the set of W2R delay offsets associated with the temperature range into which the current temperature falls and add each of the W2R delay offsets to the delay time thresholds for the read levels that correspond to the W2R delay offsets. Offsets for other types of operating characteristics can be determined similarly. For example, a deck-based offset can be determined using a deck offset table 610 shown in FIG. 6B, and an electrical-distance-based offset can be determined using an electrical distance offset table 620 shown in FIG. 6C. In other embodiments, the read voltage adjustment component 113 can add each of the W2R delay offsets to delay ranges for the read levels that correspond to the W2R delay offsets, e.g., by adding each W2R delay offset to both ends of the delay range for the read level that corresponds to the W2R delay offset.

Although the delay time threshold determiner 114 is described as processing OC threshold values 306 and determining W2R delay time threshold values 314, in other embodiments the delay time threshold determiner 114 can process OC threshold ranges and/or determine W2R delay time ranges. Each end of a time range can correspond to a threshold value. Thus, in other embodiments, OC threshold ranges can be converted to or from OC thresholds 306, and W2R delay time ranges can be converted to or from W2R delay time thresholds 314.

Figure 3B:
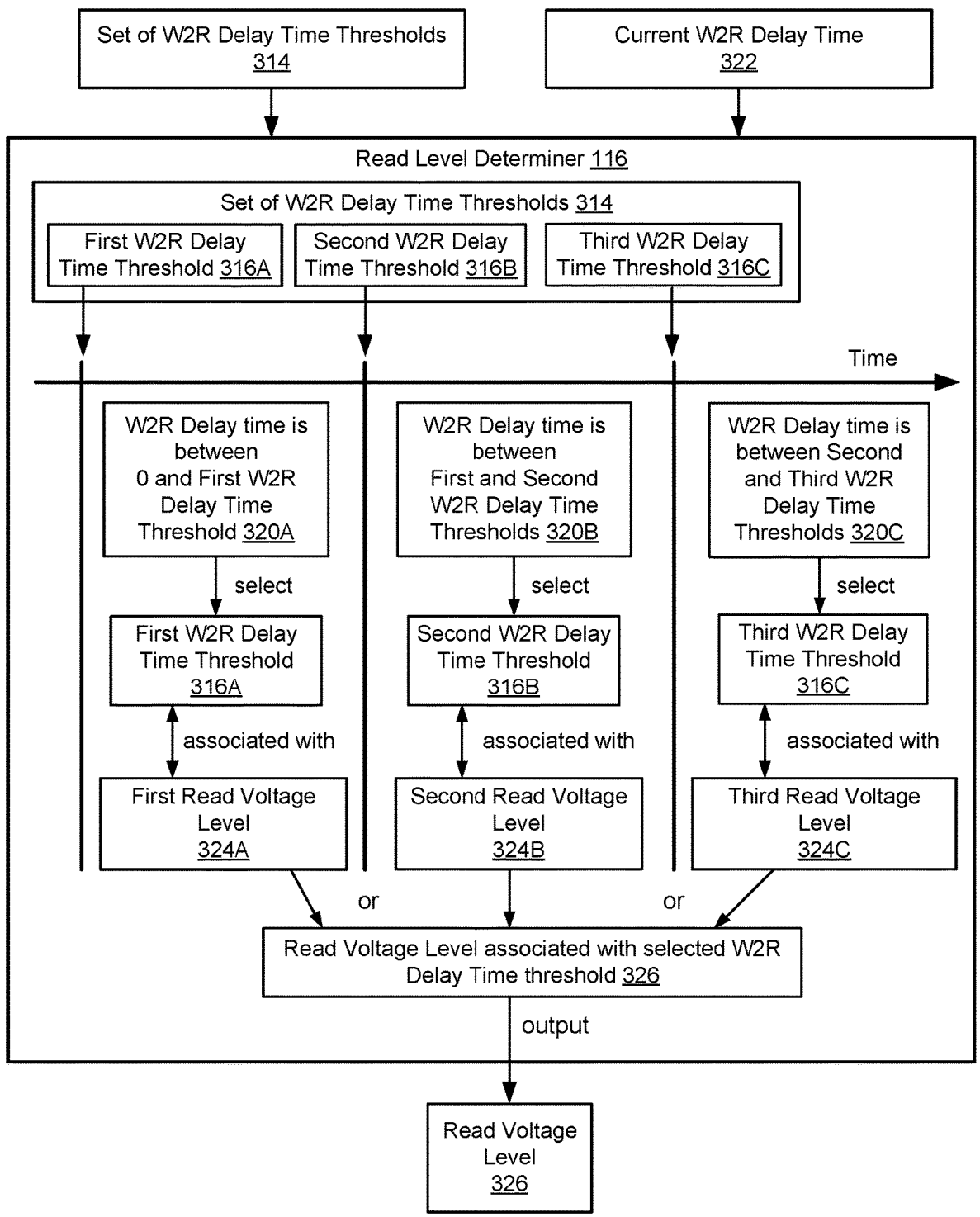
FIG. 3B illustrates an example read level determiner that uses adjustable write-to-read delay time thresholds in accordance with some embodiments.

FIG. 3B illustrates an example read level determiner 116 that uses adjustable write-to-read delay time thresholds in accordance with some embodiments. The read level determiner 116 determines a read voltage level 326 based on a set of W2R delay time thresholds 314 and a current W2R delay time 322. The read level determiner 116 can receive the set of W2R delay time thresholds 314 and the current W2R delay time 322 as input. The W2R delay time 322 can generated by the read level determiner if not received as input. The W2R delay time 322 can be generated based on a delay between a write operation and a read operation performed on a memory unit of a memory device 130 by the memory sub-system. The W2R delay time 322 can be, e.g., the difference between a time at which the read operation was performed and a time at which the write operation was performed prior to the read operation.

The set of W2R delay time thresholds can be based on one or more operating characteristic values 302 and provided by a delay time threshold determiner 114, as described above with respect to FIG. 3A. The read level determiner 116 includes or accesses a mapping between delay time thresholds 316 and read voltage levels 324. The mapping can be stored in a data structure such as the mapping table 500 of FIG. 5A or other representation of a mapping table, for example. The data structure associates each of the delay time thresholds 316 with a corresponding read level voltage 324 to be used for read operations when a criterion based on the delay time threshold 316 is satisfied. The criterion can include a comparison between the current W2R delay time 322 and one or more of the W2R delay time thresholds 316 in the set of W2R delay time threshold 314.

Each W2R delay threshold 316 in the selected set of W2R delay thresholds 314 can be associated with a read voltage level. For example, the data structure described above can further associate each W2R delay threshold 316 in each set of W2R delay thresholds 314 with a corresponding read level.

The read level determiner 116 can select a read voltage level 326 for which a corresponding criterion 320 is satisfied by the current W2R delay time 322. To select the read voltage level 326, the read level determiner 116 compares the current W2R delay time 322 to each W2R delay time threshold 316 in the set of W2R delay time thresholds 314 and determines which of the W2R delay time thresholds 316 has a satisfied criterion 320. The comparison can be performed using the criterion 320A that is based on the W2R delay time threshold 316 to which the criterion 320 corresponds. A current W2R delay time 322 can satisfy a criterion based on a W2R delay time threshold 316 in a set of W2R delay thresholds 314 if, for example, the current W2R delay time 322 is between the W2R delay threshold 316 and a next higher (or next lower) W2R delay threshold 316 in the set 314. If the W2R delay time threshold 316 is associated with a range (e.g., is an end of a range), then the current W2R delay time 322 can satisfy a criterion based on a W2R delay time threshold 316 if the current W2R delay time 322 falls into the range associated with the W2R delay time threshold. As an example, the first W2R delay time threshold 316A can be 1 second, and the first W2R delay time threshold 316A can be associated with a first range "0<=current W2R delay time<1 second." The first range can correspond to a first criterion 320A. Further, the second W2R delay time threshold 316B can be 10 seconds, and the second W2R delay time threshold 316B can be associated with a second range "1 second<=current W2R delay time<10 seconds." The second range can correspond to a second criterion 320B. In this example, a current W2R delay time of 5 seconds satisfies the criterion 320B associated with the second W2R delay time 316B.

If the current W2R delay time 322 satisfies the criterion 320, then the read level determiner 116 can select the W2R delay time threshold 316 to which the satisfied criterion 320 corresponds. The read level determiner 116 can then select the read voltage level 324 associated with the selected W2R delay time threshold. For example, the first read voltage level 324A is associated with the first W2R delay time threshold 316A, so the selected read voltage level 326 is the first read voltage level 324A when the current W2R delay time 322 satisfies the criterion 320A that is based on the first W2R delay time threshold 316A.

Similarly, in another example, the second read voltage level 324B is associated with the second W2R delay time threshold 316B, so the selected read voltage level 326 is the second read voltage level 324B when the current W2R delay time 322 satisfies the criterion 320B that is based on the second W2R delay time threshold 316B. As yet another example, the third read voltage level 324C is associated with the third W2R delay time threshold 316C, so the selected read voltage level 326 is the third read voltage level 324C when the current W2R delay time 322 satisfies the criterion 320C that is based on the third W2R delay time threshold 316C.

Thus, if a current W2R delay time 322 of the memory sub-system 110 satisfies a criterion 320 based on one of the W2R delay thresholds 316 and the current W2R delay time, then the read level determiner 116 can determine a read voltage level 326 and cause the memory sub-system controller 115 to perform subsequent one or more read operations using the selected read voltage level 326.

Although the read level determiner 116 is described as processing W2R delay time thresholds 314, in other embodiments the read level determiner 116 can process W2R delay time ranges.

FIG. 4A is a flow diagram of an example method 400 to adjust delay time thresholds and determine a corresponding read level in accordance with some embodiments. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the read voltage adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 402, the processing device determines a first current operating characteristic value of a unit of a memory device. At operation 404, the processing device identifies, from a first set of operating characteristic thresholds, a first operating characteristic threshold value, wherein the first current operating characteristic value satisfies a first operating characteristic threshold criterion that is based on the first operating characteristic threshold value. Each of the operating characteristic thresholds can correspond to an operating characteristic range having a first end specified by the corresponding operating characteristic threshold.

At operation 406, the processing device identifies, from a plurality of sets of delay time thresholds, a set of delay time thresholds that corresponds to the first operating characteristic threshold value, wherein each of the delay time thresholds in the set is associated with a corresponding read voltage level. Each of the delay time thresholds in the set can represents an end of a corresponding range of write-to-read delay times, and the corresponding read voltage level associated with each of the delay time thresholds in the set can be used to perform a read operation on a memory component having a write-to-read delay time that is in the corresponding range of write-to-read delay times.

The set of delay time thresholds can be identified using a first mapping table that maps operating characteristic threshold values to sets of delay time thresholds, where the first mapping table maps each operating characteristic threshold to a corresponding set of delay time thresholds. The first mapping table can include a set of records, each record comprising a particular operating characteristic threshold value and a corresponding set of delay time thresholds. The processing device can identify, in the first mapping table, a record that includes the first operating characteristic threshold value, where the record further includes the identified set of delay time thresholds. The first mapping table can map each delay time threshold of each set of delay time thresholds to a corresponding read voltage level, and the read voltage level associated with the identified delay time threshold can be identified using the first mapping table.

At operation 408, the processing device identifies, from the set of delay time thresholds, a delay time threshold for which an associated delay time threshold criterion is satisfied by a current write-to-read delay time of the unit of a memory device. At operation 410, the processing device identifies a read voltage level associated with the identified delay time threshold. The processing device can perform a read operation at the unit of a memory device based on a read voltage level.

FIG. 4B is a flow diagram of an example method 420 to adjust delay time ranges and perform a read operation using a corresponding read level in accordance with some embodiments. The method 420 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 420 is performed by the read voltage adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 422, the processing device identifies a current cycle count associated with a memory sub-system. At operation 424, the processing device identifies, from a set of cycle count ranges, a cycle count range that includes the current cycle count.

At operation 426, the processing device identifies, from a plurality of sets of write-to-read (W2R) delay time ranges, a set of W2R delay time ranges that corresponds to the cycle count range, wherein each of the W2R delay time ranges represents a plurality of W2R delay times and is associated with a corresponding read voltage level used to perform a read operation on a unit of the memory device having a W2R delay time that is in the W2R delay time range. The set of W2R delay time ranges may be identified using a first mapping table that maps cycle count ranges to sets of W2R delay time ranges. The first mapping table may include a set of records, and each record may include a particular cycle count range and a corresponding set of W2R delay time range. The processing device can identify search the first mapping table for a record that includes the cycle count range that includes the current cycle count. The record, if found, specifies the identified set of W2R delay time ranges. Further, the first mapping table can each W2R delay time range of each set of W2R delay time ranges to a corresponding read voltage level, and the processing device can use the first mapping table to identify the read voltage level associated with the identified W2R delay time range.

The processing device can measure a current temperature associated with the memory sub-system and identify, from a set of temperature ranges, a temperature range that includes the current temperature associated with the memory sub-system. The processing device can also identify, from a plurality of sets of W2R delay time offsets, a set of W2R delay time offsets that corresponds to the current temperature associated with the memory sub-system, such that each W2R delay time offset in the set of W2R delay time offsets is associated with a corresponding read voltage level. The processing device can adjust the sets of write-to-read (W2R) delay time ranges based on the identified set of W2R delay time offsets. The processing device can adjust the sets of W2R delay time ranges by adding each W2R delay time offset in the identified set of W2R delay time offsets to each end of each W2R delay time range in the identified set of W2R delay time ranges.

At operation 428, the processing device identifies a W2R delay time of the unit of the memory device, wherein the identified W2R delay time is based on a time difference between a write operation and a read operation performed by the unit of the memory device. At operation 430, the processing device identifies, from the set of delay time ranges, a W2R delay time range that includes the W2R delay time of the unit of the memory device. At operation 432, the processing device identifies the read voltage level that corresponds to the identified W2R delay time range. At operation 434, the processing device performs a read operation at the unit of the memory device based on the determined read voltage level.

FIG. 5A illustrates a table 500 including example sets of write-to-read delay time thresholds corresponding to example threshold operating characteristic values of a memory sub-system in accordance with some embodiments. The table 500 maps write count thresholds 502 to W2R delay time thresholds sets 506. The table 500 further maps each delay time threshold in each set 506 to a read level 504. The table 500 specifies that for a first write count threshold (e.g., 50,000 writes) 502A, a corresponding first set of delay time thresholds 506A includes a first delay time threshold for a first read level 504A, a second delay time threshold for a second read level 504B, and a third delay time threshold for third read level 504C. The first, second, and third delay time thresholds of the first set 506A can be, for example, 1 microsecond, 1 second, and 1 hour, respectively. The tables illustrated in FIGS. 5A-5C, and 6A-6C can be generated from media characterization information associated with the memory device 130, and/or from empirical data, for example.

The table 500 specifies that the first set of delay time thresholds 506A is to be used when, for example, a current write count of a memory sub-system is between a lower limit, such as 0 writes, and the first write count threshold 502A (e.g., 50,000 writes). Further, the first set 506A specifies that the first read level 504A is to be used when a current delay time value is between a lower limit, such as 0 seconds, and the first delay time threshold (e.g., 1 microsecond). The first set 506A also specifies that the second read level 504B is to be used when the current delay time value is between the first delay time threshold (e.g., 1 microsecond) and the second delay time threshold (e.g., 1 second). The first set 506A further specifies that the third read level 504C is to be used when the current delay time value is between the second delay time threshold (e.g., 1 second) and the third delay time threshold (e.g., 1 hour).

The table 500 also specifies that a second set of delay time thresholds 506B is to be used when, for example, a current write count of a memory sub-system is between the first write count threshold 502A (e.g., 50,000 writes) and the second write count threshold 502B (e.g., 100,000 writes). Further, the second set 506B specifies that the first read level 504A is to be used when a current delay time value is between a lower limit, such as 0 seconds, and the first delay time threshold (e.g., 1 microsecond). The second set 506B also specifies that the second read level 504B is to be used when the current delay time value is between the first delay time threshold (e.g., 1 microsecond) and the second delay time threshold (e.g., 0.5 seconds). The second set 506B further specifies that the third read level 504C is to be used when the current delay time value is between the second delay time threshold (e.g., 0.5 seconds) and the third delay time threshold (e.g., 0.5 hours).

The table 500 also specifies that a third set of delay time thresholds 506C is to be used when, for example, a current write count of a memory sub-system is between the second write count threshold 502B (e.g., 100,000 writes) and the third write count threshold 502C (e.g., 150,000 writes). Further, the third set 506C specifies that the first read level 504A is to be used when a current delay time value is between a lower limit, such as 0 seconds, and the first delay time threshold (e.g., 1 microsecond). The third set 506C also specifies that the second read level 504B is to be used when the current delay time value is between the first delay time threshold (e.g., 1 microsecond) and the second delay time threshold (e.g., 0.2 seconds). The third set 506C further specifies that the third read level 504C is to be used when the current delay time value is between the second delay time threshold (e.g., 0.2 seconds) and the third delay time threshold (e.g., 0.2 hours).

FIG. 5B illustrates a table 510 including example sets of write-to-read delay time thresholds corresponding to example ranges of operating characteristic values of a memory sub-system in accordance with some embodiments. The table 510 maps write count ranges 512 to W2R delay time thresholds sets 516. The table 510 further maps each delay time threshold in each set 516 to a read level 514. The table 510 specifies that for a first write count range (e.g., 0-50,000 writes) 512A, a corresponding first set of delay time thresholds 516A includes a first delay time threshold for a first read level 514A, a second delay time threshold for a second read level 514B, and a third delay time threshold for third read level 514C. The first, second, and third delay time thresholds of the first set 516A can be, for example, 1 microsecond, 1 second, and 1 hour, respectively.

The table 510 specifies that the first set of delay time thresholds 516A is to be used when, for example, a current write count of a memory sub-system is in the first range 512A (e.g., 0-50,000 writes). The first set 516A specifies delay time thresholds as described above for table 500 of FIG. 5A. The table 500 also specifies that a second set of delay time thresholds 506B is to be used when, for example, a current write count of a memory sub-system is in the second range 512B (e.g., 50,000-100,000 writes). The second set 516B specifies delay time thresholds as described above for table 500 of FIG. 5A. The table 510 also specifies that a third set of delay time thresholds 506C is to be used when, for example, a current write count of a memory sub-system is in the third range 512C (e.g., 100,000-150,000 writes). The third set 516C specifies delay time thresholds as described above for table 500 of FIG. 5A.

FIG. 5C illustrates a table 520 including example sets of write-to-read delay time ranges corresponding to example ranges of operating characteristic values of a memory sub-system in accordance with some embodiments. The table 520 maps write count ranges 522 to W2R delay time ranges 526. The table 520 further maps each delay time range in each set 526 to a read level 524. The table 520 specifies that for a first write count range (e.g., 0-50,000 writes) 522A, a corresponding first set of delay time ranges 526A includes a first delay time range for a first read level 524A, a second delay time range for a second read level 524B, and a third delay time range for third read level 524C. The first, second, and third delay time ranges of the first set 526A can be, for example, (0 s, 1 s), (1 s, 1 hr), and (1 hr, unlimited), respectively.

The table 520 specifies that the first set of delay time ranges 526A is to be used when, for example, a current write count of a memory sub-system is in the first range 522A (e.g., 0-50,000 writes). The first set 526A specifies that the first read level 524A is to be used when the current W2R delay time is in the first delay time range of the first set 526A, the second read level 524B is to be used when the current W2R delay time is in the second delay time range of the first set 526A, and the third read level 524C is to be used when the current W2R delay time is in the third delay time range of the first set 526A.

The table 520 also specifies that the second set of delay time ranges 526B is to be used when, for example, a current write count of a memory sub-system is in the second range 522B (e.g., 50,000-1000,000 writes). The second set 526B specifies that the first read level 524A is to be used when the current W2R delay time is in the first delay time range of the second set 526B, the second read level 524B is to be used when the current W2R delay time is in the second delay time range of the second set 526B, and the third read level 524C is to be used when the current W2R delay time is in the third delay time range of the second set 526B.

The table 520 further specifies that the third set of delay time ranges 526C is to be used when, for example, a current write count of a memory sub-system is in the third range 522C (e.g., 100,000-1500,000 writes). The third set 526C specifies that the first read level 524A is to be used when the current W2R delay time is in the first delay time range of the third set 526C, the second read level 524B is to be used when the current W2R delay time is in the second delay time range of the third set 526C, and the third read level 524C is to be used when the current W2R delay time is in the third delay time range of the third set 526C.

FIG. 6A illustrates a table 600 including example sets of W2R delay time offsets 606 corresponding to temperatures 602 of a memory sub-system in accordance with some embodiments. The table 600 maps temperature ranges 602 to W2R delay offset sets 606. The table 600 further maps each offset in each set 606 to a read level 604. The table 600 specifies that for a first temperature range (e.g., 0-45 C) 602A, a corresponding first set of delay offsets 606A includes a first delay offset for a first read level 604A, a second delay offset for a second read level 604B, and a third delay offset for a third read level 604C. The first, second, and third delay offsets in the first set 606A are 0 microseconds, −100 milliseconds, and −2 minutes, respectively.

The table 600 also specifies that for a second temperature range (e.g., 45 C-70 C) 602B, a corresponding second set of delay offsets 606B includes a first delay offset for a first read level 604A, a second delay offset for a second read level 604B, and a third delay offset for a third read level 604C. The first, second, and third delay offsets in the second set 606B are 0 microseconds, −300 milliseconds, and −4 minutes, respectively.

FIG. 6B illustrates a table 610 including example sets of W2R delay time offsets 616 corresponding to deck values 612 of a memory sub-system in accordance with some embodiments. The table 610 maps deck values 612 to W2R delay offset sets 616. The table 610 further maps each offset in each set 616 to a read level 614. The table 610 specifies that for a first deck (e.g., Deck 0) 612A, a corresponding first set of delay offsets 616 includes a first delay offset for a first read level 614A, a second delay offset for a second read level 614B, and a third delay offset for a third read level 614C. The first, second, and third delay offsets for the first deck 612A are 0 microseconds, −260 milliseconds, and −2 minutes, respectively.

The table 610 also specifies that for a second deck (e.g., Deck 1) 612B, a corresponding second set of delay offsets 616 includes a first delay offset for a first read level 614A, a second delay offset for a second read level 614B, and a third delay offset for a third read level 614C. The first, second, and third delay offsets for the second deck 612B are 0 microseconds, −460 milliseconds, and −3 minutes, respectively.

FIG. 6C illustrates a table 620 including example sets of write-to-read delay time offsets 626 corresponding to electrical distances 622 of a memory sub-system in accordance with some embodiments. The table 620 maps electrical distances 622 to W2R delay offset sets 626. The table 620 further maps each offset in each set 626 to a read level 624. The table 620 specifies that for an electrical distance (e.g., Electrical Distance 0) 622A, a corresponding first set of delay offsets 626 includes a first delay offset for a first read level 624A, a second delay offset for a second read level 624B, and a third delay offset for a third read level 624C. The first, second, and third delay offsets for the first deck 622A are 0 microseconds, −325 milliseconds, and −1 minute, respectively.

The table 620 also specifies that for a second electrical distance (e.g., Electrical Distance 1) 622B, a corresponding second set of delay offsets 626 includes a first delay offset for a first read level 624A, a second delay offset for a second read level 624B, and a third delay offset for a third read level 624C. The first, second, and third delay offsets for the second electrical distance 622B are 0 microseconds, −400 milliseconds, and −2 minutes, respectively.

Figure 7:
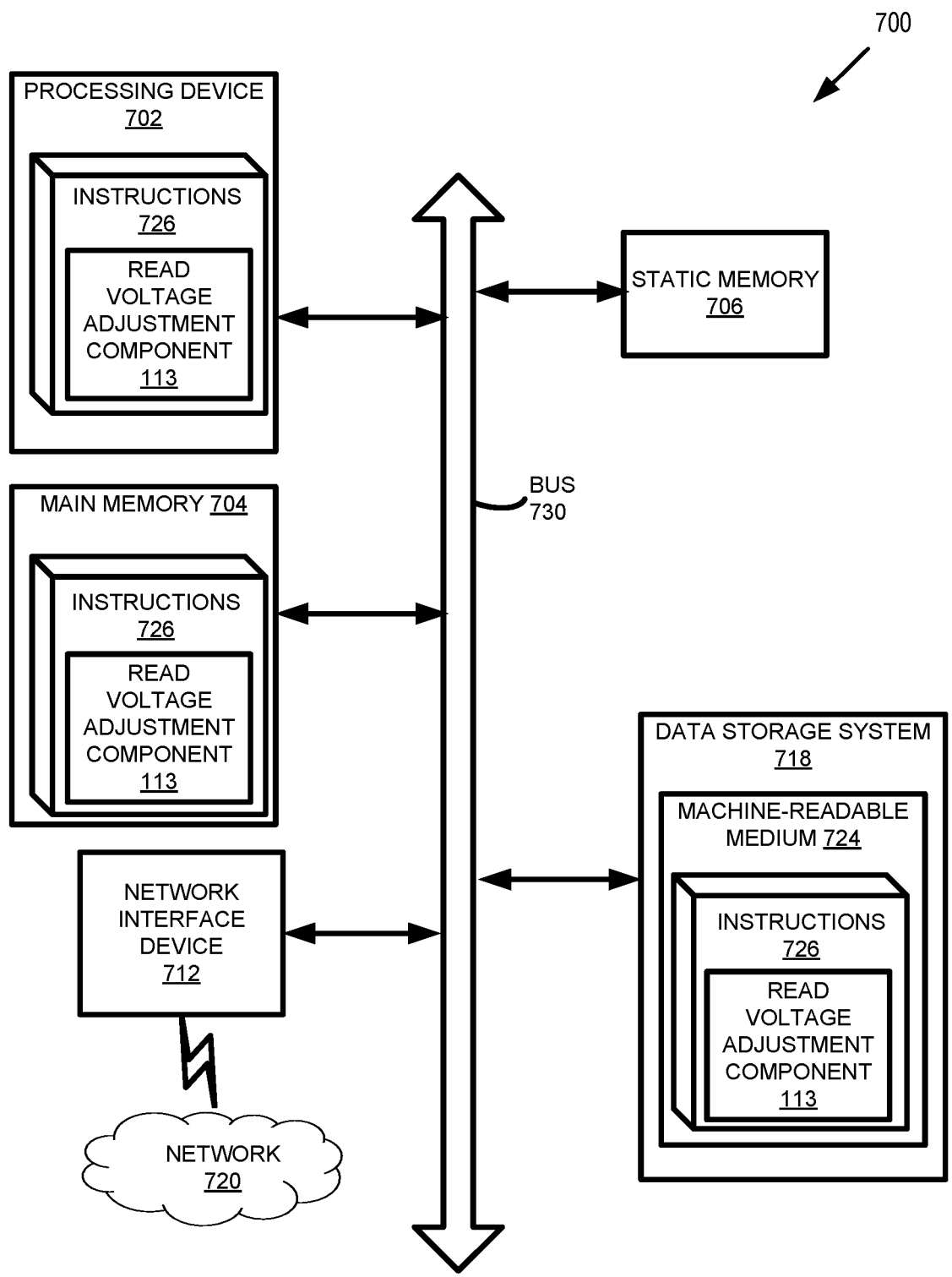
FIG. 7 is a block diagram of an example computer system in which implementations of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to a read voltage adjustment component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a read voltage adjustment component (e.g., the read voltage adjustment component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
    determining a first current operating characteristic value of a unit of the memory device;
    identifying, from a first set of operating characteristic thresholds, a first operating characteristic threshold value, wherein the first current operating characteristic value satisfies a first operating characteristic threshold criterion that is based on the first operating characteristic threshold value;
    identifying, from a plurality of sets of write-to-read (W2R) delay time thresholds, a set of W2R delay time thresholds that corresponds to the first operating characteristic threshold value, wherein each of the W2R delay time thresholds in the set is associated with a respective read voltage level;
    identifying, from the set of W2R delay time thresholds, a W2R delay time threshold for which an associated W2R delay time threshold criterion is satisfied by a current W2R delay time of the unit of the memory device; and
    identifying a read voltage level associated with the identified W2R delay time threshold.

2. The system of claim 1, the operations further comprising:
performing a read operation at the unit of the memory device based on the read voltage level associated with the identified W2R delay time threshold.

3. The system of claim 1, the operations further comprising:
determining the current W2R delay time of the unit of the memory device based on a time difference between a read operation and a write operation performed on the unit of the memory device prior to the read operation.

4. The system of claim 1, wherein each of the operating characteristic thresholds corresponds to a respective operating characteristic range having a first end specified by the corresponding operating characteristic threshold.

5. The system of claim 1, wherein each of the W2R delay time thresholds in the set represents an end of a respective range of W2R delay times, and the corresponding read voltage level associated with each of the W2R delay time thresholds in the set is used to perform a read operation on a unit of the memory device having a W2R delay time that is in the corresponding range of W2R delay times.

6. The system of claim 1, wherein the set of W2R delay time thresholds is identified using a first mapping table that maps operating characteristic threshold values to sets of W2R delay time thresholds, wherein the first mapping table maps each operating characteristic threshold to a corresponding set of W2R delay time thresholds.

7. The system of claim 6, wherein the first mapping table comprises a plurality of records, each record comprising a particular operating characteristic threshold value and a corresponding set of W2R delay time thresholds, and wherein identifying, from a plurality of sets of W2R delay time thresholds, a set of W2R delay time thresholds that corresponds to the first operating characteristic threshold value comprises:
identifying, in the first mapping table, a record that comprises the first operating characteristic threshold value, wherein the record further comprises the identified set of W2R delay time thresholds.

8. The system of claim 6, wherein the first mapping table further maps each W2R delay time threshold of each set of W2R delay time thresholds to a corresponding read voltage level, and the read voltage level associated with the identified W2R delay time threshold is identified using the first mapping table.

9. The system of claim 1, wherein the first current operating characteristic value comprises one or more of: a write count of the unit of the memory device, an operating temperature, a layer identifier of the unit of the memory device, or an electrical distance of the unit of the memory device.

10. The system of claim 1, the operations further comprising:
determining a second current operating characteristic value of the unit of the memory device;

identifying, from a second set of operating characteristic thresholds, a second operating characteristic threshold value, wherein the second current operating characteristic value satisfies a second operating characteristic threshold criterion that is based on the second operating characteristic threshold value;

identifying, from a plurality of sets of W2R delay time offsets, a set of W2R delay time offsets that corresponds to the second operating characteristic threshold value, wherein each of the W2R delay time offsets in the set is associated with a corresponding read voltage level; and updating the set of W2R delay time thresholds based on the set of W2R delay time offsets.

11. The system of claim 10, wherein updating the set of W2R delay time thresholds based on the set of W2R delay time offsets comprises:

adding each W2R delay time offset in the set of W2R delay time offsets to a corresponding W2R delay time threshold in the set of W2R delay time thresholds.

12. The system of claim 10, wherein the set of W2R delay time offsets that corresponds to the second operating characteristic threshold value is identified using a second mapping table that maps operating characteristic threshold values to sets of W2R delay time offsets, wherein the second mapping table maps each operating characteristic threshold to a corresponding set of W2R delay time offsets.

13. The system of claim 10, wherein the second current operating characteristic value comprises one or more of: an operating temperature, a layer identifier of the unit of the memory device, an electrical distance of the unit of the memory device, or a write count of the unit of the memory device.

14. A non-transitory computer readable medium comprising instructions, which when executed by a processing device, cause the processing device to perform operations comprising:

identifying a current cycle count associated with a unit of a memory device;

identifying, from a set of cycle count ranges, a cycle count range that includes the current cycle count;

identifying, from a plurality of sets of write-to-read (W2R) delay time ranges, a set of W2R delay time ranges that corresponds to the cycle count range, wherein each of the W2R delay time ranges represents a plurality of W2R delay times and is associated with a corresponding read voltage level used to perform a read operation on a unit of the memory device having a W2R delay time that is in the W2R delay time range;

identifying a W2R delay time of the unit of the memory device, wherein the identified W2R delay time is based on a time difference between a write operation and a read operation performed by the unit of the memory device;

identifying, from the set of W2R delay time ranges, a W2R delay time range that includes the W2R delay time of the unit of the memory device;

identifying the read voltage level that corresponds to the identified W2R delay time range; and performing a read operation at the unit of the memory device based on the identified read voltage level.

15. The non-transitory computer readable medium of claim 14, wherein the set of W2R delay time ranges is identified using a first mapping table that maps cycle count ranges to sets of W2R delay time ranges, wherein the first mapping table maps each cycle count range to a corresponding set of W2R delay time ranges.

16. The non-transitory computer readable medium of claim 15, wherein the first mapping table comprises a plurality of records, each record comprising a particular cycle count range and a corresponding set of W2R delay time range, and wherein identifying, from a plurality of sets of W2R delay time ranges, a set of W2R delay time ranges that corresponds to the cycle count range comprises:

identifying, in the first mapping table, a record that comprises the cycle count range that includes the current cycle count, wherein the record further comprises the identified set of W2R delay time ranges.

17. The non-transitory computer readable medium of claim 15, wherein the first mapping table further maps each W2R delay time range of each set of W2R delay time ranges to a corresponding read voltage level, and the read voltage level associated with the identified W2R delay time range is identified using the first mapping table.

18. The non-transitory computer readable medium of claim 14, the operations further comprising:

measuring a current temperature associated with the memory device;

identifying, from a set of temperature ranges, a temperature range that includes the current temperature associated with a memory sub-system;

identifying, from a plurality of sets of W2R delay time offsets, a set of W2R delay time offsets that corresponds to the current temperature associated with the memory sub-system, wherein each W2R delay time offset in the set of W2R delay time offsets is associated with a corresponding read voltage level; and adjusting the sets of W2R delay time ranges based on the identified set of W2R delay time offsets.

19. The non-transitory computer readable medium of claim 18, wherein adjusting the sets of W2R delay time ranges based on the identified set of W2R delay time offsets comprises:

adding each W2R delay time offset in the identified set of W2R delay time offsets to each end of each W2R delay time range in the identified set of W2R delay time ranges.

20. A method comprising:

determining a first current operating characteristic value of a unit of a memory device;

identifying, from a first set of operating characteristic thresholds, a first operating characteristic threshold value, wherein the first current operating characteristic value satisfies a first operating characteristic threshold criterion that is based on the first operating characteristic threshold value;

identifying, from a plurality of sets of write-to-read (W2R) delay time thresholds, a set of W2R delay time thresholds that corresponds to the first operating characteristic threshold value, wherein each of the W2R delay time thresholds in the set is associated with a respective read voltage level;

identifying, from the set of W2R delay time thresholds, a W2R delay time threshold for which an associated W2R delay time threshold criterion is satisfied by a current W2R delay time of the unit of the memory device; and identifying a read voltage level associated with the identified W2R delay time threshold.

* * * * *